(12) United States Patent
Fairbrother et al.

(10) Patent No.: US 9,633,323 B2
(45) Date of Patent: Apr. 25, 2017

(54) INTEGRATED MODELING AND ANALYSIS IN A DISCRETE EVENT SIMULATION

(71) Applicant: LOCKHEED MARTIN CORPORATION, Bethesda, MD (US)

(72) Inventors: Richard G. Fairbrother, Vestal, NY (US); Kimberly Z. Homsher, Marcellus, PA (US); Dennis J. Genaw, Syracuse, NY (US); Michael A. Leonardo, Syracuse, NY (US)

(73) Assignee: Lockheed Martin Corporation, Bethesda, MD (US)

(*) Notice: Subject to any disclaimer, the term of this patent is extended or adjusted under 35 U.S.C. 154(b) by 504 days.

(21) Appl. No.: 13/826,520

(22) Filed: Mar. 14, 2013

(65) Prior Publication Data
US 2014/0278290 A1 Sep. 18, 2014

(51) Int. Cl.
*G06Q 10/06* (2012.01)
*G06F 17/50* (2006.01)

(52) U.S. Cl.
CPC ... *G06Q 10/06375* (2013.01); *G06F 17/5009* (2013.01); *G06F 17/5022* (2013.01);
(Continued)

(58) Field of Classification Search
None
See application file for complete search history.

(56) References Cited

U.S. PATENT DOCUMENTS 6,324,495 B1 * 11/2001 Steinman ............ G06F 17/5009
703/13
6,832,205 B1 12/2004 Aragones et al.
(Continued)

OTHER PUBLICATIONS

Persson, Fredrik & Araldi, Mirko "The Development of a Dynamic Supply Chain Analysis Tool—Integration of SCOR and Discrete Event Simulation" Int'l J. Production Economics, vol. 121, issue 2, pp. 574-583 (2007) available from <http://www.sciencedirect.com/science/article/pii/S0925527307000588#>.*
(Continued)

*Primary Examiner* — Kamini S Shah
*Assistant Examiner* — Jay B Hann
(74) *Attorney, Agent, or Firm* — Howard IP Law Group, PC (57) ABSTRACT

An integrated modeling and analysis system (IMAS) receives documents containing information relating to an overall operations system from a number of integrated product teams (IPTs). The IMAS creates a model architecture of the overall system the information received from the participating IPTs. The IMAS automatically imports the information without any interaction from support personnel. A discrete event modeling (DES) application in communication with the IMAS creates a DES model based on the model architecture in the IMAS. The DES application runs a simulation on the model generating statistical data relating to the overall system for analysis. The statistical data generates output reports in a format compatible with the analysis tools of the user. The IMAS includes a customizable user interface which allows a stakeholder to link and control the modeling information received from all other participating IPTs. Prior simulations and results can be archived for later reference.

12 Claims, 5 Drawing Sheets

(52) U.S. Cl.
CPC ......... *G06Q 10/06313* (2013.01); *G05B 2219/34354* (2013.01); *G06Q 10/0633* (2013.01)

(56) References Cited

U.S. PATENT DOCUMENTS

| | | |
|---|---|---|
| 6,961,687 B1 | 11/2005 | Myers, Jr. et al. |
| 7,315,805 B2 | 1/2008 | Slater |
| 7,752,144 B1 | 7/2010 | Myers, Jr. et al. |
| 8,855,973 B2* | 10/2014 | Baym et al. .................. 703/2 |
| 2008/0126067 A1 | 5/2008 | Haas et al. |
| 2008/0154570 A1* | 6/2008 | Lendermann et al. ......... 703/17 |
| 2008/0300705 A1 | 12/2008 | Bagchi et al. |
| 2009/0204463 A1* | 8/2009 | Burnett et al. ................ 705/7 |
| 2010/0100510 A1* | 4/2010 | Balaban et al. ................ 703/6 |
| 2011/0173034 A1 | 7/2011 | Riepshoff et al. |
| 2011/0202326 A1 | 8/2011 | Salemann |

OTHER PUBLICATIONS

International Search Report dated Aug. 22, 2014 for related International Application No. PCT/US14/29307.

\* cited by examiner

INTEGRATED MODELING AND ANALYSIS IN A DISCRETE EVENT SIMULATION

STATEMENT OF GOVERNMENT INTEREST

This invention was made with Government support under Contract No. W15P7T-06-C-T004 awarded by the Department of the Army. The Government has certain rights in this invention.

FIELD OF THE INVENTION

This disclosure relates to the field of sustainment and operations of systems. More particularly, this disclosure relates to modeling systems for sustainment and operations.

BACKGROUND

Systems are designed, deployed and operated for the benefit of one or more stakeholders. A stakeholder is any person or group within an organization which will be affected in some way in the implementation, operation, updating, or maintenance of the system. For example, in a system designed for operations and support of those operations, stakeholders may include groups representing engineering, maintenance, logistics, finance and operations. Any change or update to the system or any part thereof, may have effects that ripple through the organization and impact one or more stakeholders in some way.

As systems are developed, the goals and objectives of the stakeholders are taken into consideration and the processes designed for the system are directed to meeting the goals and objectives of the stakeholders. In larger organizations, the processes may become complex, and the corresponding systems grow in complexity proportionately. Further, as organizations grow, systems may be deployed at geographically dispersed locations. Based on the location and other factors, different system configurations used across the organization may evolve.

Independently operating groups may have responsibility for specific aspects of a system. Multiple independent groups may represent sub-systems or system components which function to define an overall operations system producing an integrated product. Therefore, each group or integrated product team (IPT) may develop and maintain information specific to a segment or product line of an overall system. This information may be maintained independently of information maintained by other IPTs involved in the same overall system.

In order for a stakeholder to derive the intended benefit from the system, it is imperative that the system be maintained in a state of operational readiness. To achieve this, hardware and software components which constitute the system must be maintained in working condition. Parts that break, wear out, or are recalled, must be removed from the system and/or repaired and replacement parts reinstalled. During the time it takes to remove a part and receive and install the replacement part, the system operates, if at all, at a diminished capacity.

Another factor integral to the overall value of a system is the cost of ownership. The cost of ownership of a system refers to the total costs of deploying, operating and maintaining a system throughout the entire life cycle of the system. System sustainment costs may contribute to over 80% of the overall life cycle costs of a system. Some of the primary costs which impact system sustainment include the operational profile of the system, the reliability of system parts, and the supply chain architecture. Reliability is determined based on the failure rate of system parts and the ability to replace failed parts when needed. The supply chain architecture determines the availability of spare or replacement parts based on the location of the system relative to a repair depot. The minimization of system downtime and the overall cost of ownership can be competing factors which must be managed by the stakeholder to maximize system performance while insuring the system remains economically justifiable for the organization.

During system design, prior to deployment, the ultimate costs of factors such as system reliability and supply chain architecture are not known. This uncertainty creates challenges when designing systems for optimal benefit relative to dollars spent. System modeling is used to model the behavior of a proposed or existing system to determine future needs and costs of operations. Discrete event simulation (DES) provides a method of defining models that are representative of a system and defining various and interrelated environmental properties that occur when operating the system. In DES, events which occur within the constructed model involve state changes of various system components. These events may trigger other events downstream. As events are triggered, they are stored in an event log in chronological order. The logged events may reflect future state changes of one or more associated system components. As each event is simulated, the event list is updated with newly triggered events and is reordered according to the time sequence in which the events are modeled to occur.

There are commercially available DES software programs which include a DES engine for running a system model simulation. For example, Arena®, a DES application available from Rockwell Automation, Inc. of Milwaukee Wis. may be used to perform discrete event simulations. DES software packages, however, require the system model to be fully defined within the DES software. This requires the enlistment of software engineers well versed in DES programming to manually code the model into the DES applications. Conventional DES models use spreadsheets as inputs serving as a baseline from which the simulation is started. Relationships between system components are statically defined in the model and are used by the DES engine to simulate interdependent events that may affect multiple system components. When analysis of statistical data generated by the simulation indicates that adjustments or changes to the system model need to occur (e.g. component changes for what-if analysis), the model must be redefined through the source code that inserts the model into the DES software. Thus, the system model changes must be re-programmed manually by programmers proficient in the DES language. Creation of models in this manner, and the subsequent reprogramming that may be needed, are time consuming. Furthermore, these manual programming changes do not provide high fidelity analytic data due to their limited ability to define the complexities and interrelationships inherent in most systems.

When a system involves a number of IPTs, each IPT serves as a stakeholder. Each stakeholder has an intimate familiarity with his/her particular product line, and maintains detailed information regarding the product line. This detailed information may include DES modeling information for the product line, which is typically arranged in a spreadsheet format. In systems for the operation and support of military operations, IPTs may maintain information in a standardized format such as the military standard (MIL-STD). MIL-STD format establishes uniform engineering and technical requirements for military-unique or substantially modified commercial processes, procedures, practices, and methods. As a standard, MIL-STD provides a picture of system processes that are readily understandable between and among independent IPTs.

In a conventional DES configuration, the development of a system model requires extensive configuration in the form of programming to provide input data that is representative of the system being modeled. In complex systems, such as those systems involving multiple IPTs, programmers responsible for defining the DES model must translate the data received from the various product lines defining the system, and provide an accurate model definition which defines not only each individual product line, but the inter-relationships between multiple product lines in the overall system.

While programmers possess the skills to create the DES model, they do not necessarily possess the familiarity with a product line that the team responsible for that product line possesses. Therefore, a knowledge transfer from the team to the programmer must occur. This transfer of knowledge may be subject to misunderstanding, misinterpretation or omissions due at least in part, to the programmers' lack of familiarity with the product line.

A system which defines a system model for discrete event simulation without the disadvantages of requiring reprogramming is desired.

SUMMARY

An integrated modeling and analysis system (IMAS) for modeling a system in a discrete event simulation (DES) comprises a first processor in communication with a first memory. The first memory stores instructions that when executed by the first processor cause the first processor to define a database. The database is configured to directly import DES model information from at least one integrated product team (IPT), the at least one IPT maintaining DES model information for a product line which represents a portion of an overall operations system. The database stores the imported DES model information in at least one input data set. The processor further causes to be stored in the first memory information relating to at least one relationship between a first data element in a first input data set and a second data element in a second input data set. The information relating to the data relationship may be in the form of a structured query language (SQL) query. The first processor is further configured to create a user interface for displaying to a user on a display, the user interface accepting from a user at least one input parameter for running a simulation of an overall operations system.

A second processor is configured in communication with a second memory, the second memory containing instructions that when executed by the second processor cause the second processor to run a DES application which performs a simulation of the overall operations system. The DES application is in communication with the database via the first processor. The DES application is configured to query the database and extract information relating to a DES model of the overall system based on the at least one input data set and the information relating to the at least one relationship between the first data element in the first input data set and the second data element in the second input data set, create a DES model and a DES event list based on the extracted DES model information, and perform a simulation based on the DES model and the DES event list, wherein performing the simulation generates statistics data, and storing the statistics data in the database in at least one output data set.

The first processor is further configured to create at least one output report based on the at least one input data set, the at least one output data set, and the at least one input parameter.

At least one IPT maintains DES model documents relating to a product line associated with the IPT. The DES model documents may be stored in conformance with a predetermined documenting standard such as a military standard MIL-STD format or protocol. In one configuration, the DES model documents are imported directly to the database. The DES application creates a DES model from the imported data without the need for manual configuration of the DES model documents and accounts for inter-relationships between the data of more than one IPT. Since the IMAS automatically imports the system information from the participating IPTs, changes made to the DES model documents are updated and reflected in the model architecture in the IMAS as soon as those changes are made at the IPTs and imported to the database. The DES application uses the updated modeling architecture to generate an up-to-date model of the overall system without the need for reprogramming the DES application to account for the changes.

According to another aspect of the disclosure, a non-transitory computer-readable medium stores instructions that when executed by a processor cause the processor to define a database and to store in memory, information relating to at least one relationship between a first data element and a second data element. The first data element may relate to a DES model document maintained by a first IPT, and the second data element may relate to a DES model document maintained by a second IPT. The database is configured to directly import DES model documents maintained by at least one IPT and to store the information in the DES model documents in at least one input data set within the database. A further set of instructions creates a user interface for displaying to a user on a display, the user interface being configured to receive at least one input parameter from a user. The at least one input parameter relates to running a simulation of an overall operations system.

The computer-readable medium further contains instructions which cause the processor to process queries from a DES application and generate DES model information based on the at least one input parameter and the at least one input data set. The processor transmits the DES model information to the DES application. The instructions further cause the processor to receive statistics information from the DES application during a simulation of the overall operations system and to store the statistics data within the database as at least one output data set.

Additional instructions cause the processor to periodically provide updated DES model information to the DES application based on the statistics data during the simulation of the overall operations system.

According to another aspect of the disclosure, a computer implemented method of integrating modeling and analysis of a global sustainment solution for an operations system includes, importing data contained in at least one DES model document directly into a database and storing the imported data as at least one input data set; defining in a set of SQL queries, at least one data relationship between a first data element in a first input data set and a second data element in a second input data set; receiving, via a user interface at least one input parameter relating to a DES simulation and communicating with a common modeling engine of a DES application to provide the at least one input parameter to the common modeling engine and to receive from the common modeling engine at least one query to extract data from the at least one data set, generating DES model information from the extracted data and providing the DES model information to the common modeling engine; receiving from a DES engine statistics data relating to a simulation being run by the DES engine and storing the statistics data in at least one output data set within the database.

BRIEF DESCRIPTION OF THE DRAWINGS

The following detailed description may be better understood in combination with the accompanying drawings, in which like numbers represent like elements, and wherein.

DETAILED DESCRIPTION

It is to be understood that the figures and descriptions in this disclosure have been simplified to illustrate elements that are relevant for a clear understanding of the present invention, while eliminating, for the purpose of clarity, many other elements found in typical computer systems and methods for processing analysis data such as modeling and analysis of operations systems. Those of ordinary skill in the art may recognize that other elements and/or steps are desirable and/or required in implementing the embodiments described herein. However, because such elements and steps are well known in the art, and because they do not facilitate a better understanding of the present invention, a discussion of such elements and steps is not provided herein.

Discrete event simulation (DES) involves the modeling of the operation of a system. The operation of the system is represented as a chronological sequence of events. Each event may be viewed as occurring at a particular point of time and each event impacts at least one state in the system. The DES system is generally implemented in software on a general purpose computer. The simulation must keep track of time; therefore, the DES application maintains a simulation clock in which time progresses or "hops" from one event to the next scheduled event. The real-time interval between events may be greater than that of the simulation clock, but if no events are scheduled during that real-time interval, those time periods are ignored by the DES application.

The DES application maintains one or more event lists containing a chronological list of pending events. An event may be identified by its type and by a particular time at which it is to occur. The type of the event determines what software code should be executed to generate the simulation of that event in the modeled system. As each event is processed, the DES application collects statistical data relating to the results of the simulation to that point. At the end of the simulation, the collected statistics are provided as output for analysis. Analysis of the statistics provides modeled outcomes which may be experienced during the actual operation of the system. The statistics may indicate particular portions of the system where bottlenecks or failures may occur. This analysis provides the stakeholder with information which may be used to modify or redesign the system, or identify where potential repair or maintenance needs may occur.

Figure 1:
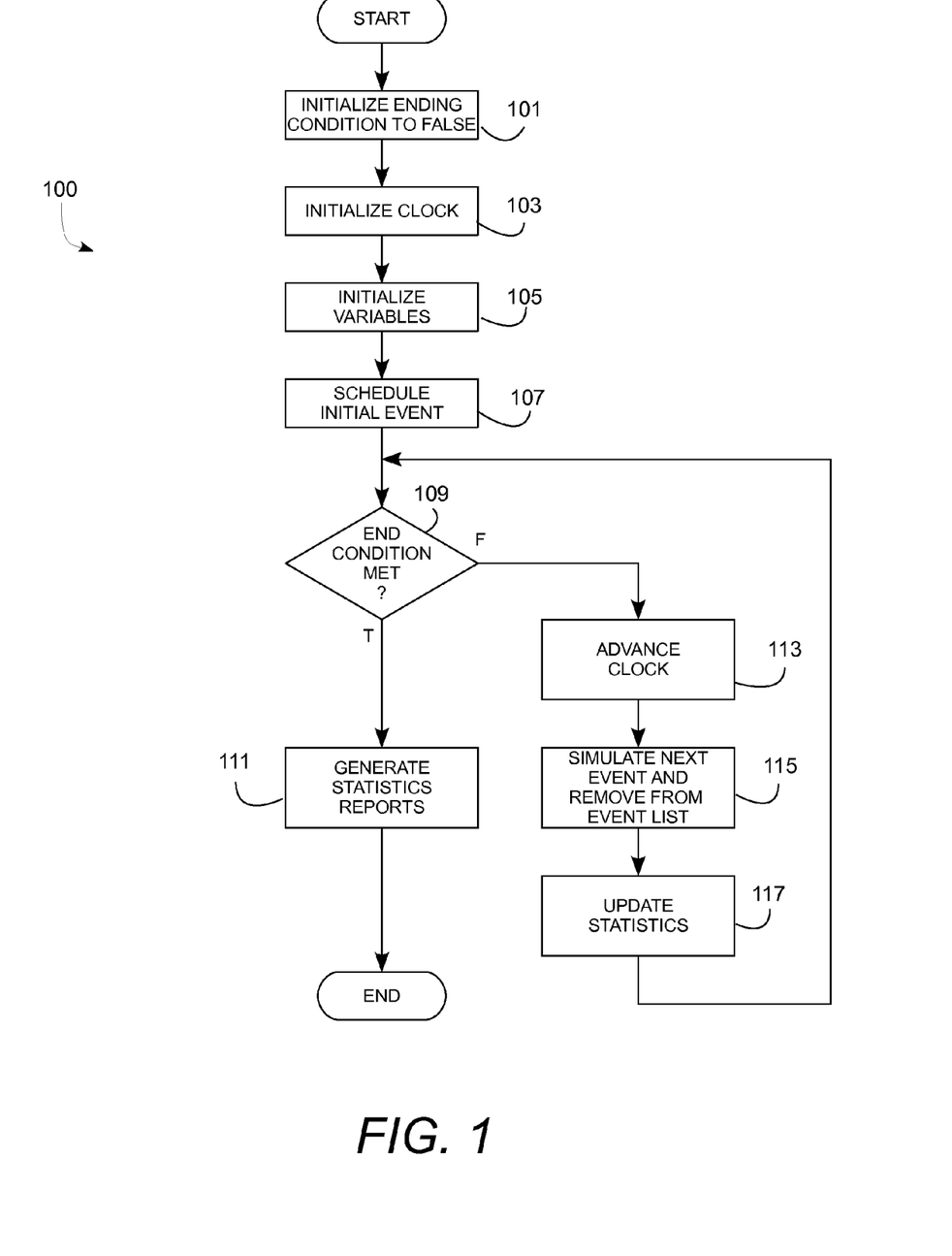
FIG. 1 is a block diagram illustrating the processing loop of a discrete event simulation engine according to an embodiment of the disclosure.

FIG. 1 is a block diagram illustrating a simulation loop 100 performed by a DES engine within a DES application. An ending condition is defined which indicates to the DES engine logic that the simulation is complete. The ending condition may represent some future point in time. Other conditions, such as when the simulation indicates a system failure, or a bottleneck that reduces system performance below a predetermined threshold level, may also define an ending condition depending on the user preferences. As the simulation begins, the ending condition is set to false 101. The simulation clock is initialized to a virtual time $T_0$ 103. Variables are defined to represent the various states of the system components. Through changes in the states of these variables, statistical data will be amassed during the simulation. These variables are initialized 105 and an initial event is scheduled 107 to begin the simulation loop 100.

Logic within the DES engine then performs the simulation loop. The simulation loop may be implemented as software running on a computer processor, the processor configured to receive instructions stored as software and to execute the instructions to perform the functions of the DES simulation loop. For example, the instructions may implement a DO loop, or a WHILE loop to implement simulation loop 100 in software. At each iteration of the simulation loop 100, the DES engine logic reads the value of the ending condition to determine the relevant ending condition and whether the condition is met (109). If the ending condition is false, the next iteration of the loop is performed. At each iteration, the DES engine advances the simulation clock 113 to the next time interval when a next ordered event is scheduled to occur. The next event is simulated and removed from the event list 115. Events are identified by an event type, which determines the program code which is executed by the processor to simulate the event. As the event is simulated, statistics regarding the overall system states are generated and tracked. The statistics are updated 117 while the event is simulated. The updated statistics may include a state change which affects the value of the ending condition. If during the simulation of an event the ending condition becomes true, the loop will stop before performing a next iteration. When the ending condition is evaluated 109 to be true, statistics reports based on the statistics generated and stored during the simulation, are generated 111 as output of the simulation. If the ending condition has not changed and the value of the ending condition is still false, then the loop will continue to the next iteration and the next scheduled event will be simulated.

In a conventional application of DES, the simulation loop 100 is performed by the DES engine after the system model has been manually generated by the user. The intent of these models is to simulate the system operations. As events are simulated, the system component being modeled may experience state changes. In addition, other system components may experience changes in their states based on interactions between the component currently being simulated and the other system components (e.g. the support structure necessary to sustain those systems during the system's life cycle). In an attempt to capture the intricacies of these interactions, extensive data sets are defined and created to reflect the system configuration, the deployment and operation of the system and the sustainment support structure. However, since these conventional tools are "spreadsheet based", the results provided by the models simply summarize the requirements necessary to sustain a number of systems during this period and do not provide a high fidelity picture of the overall system.

In order to provide a more comprehensive model of a complex system, the model needs to include multiple system configurations which may be located across multiple locations which may be operated at different time intervals. However, conventional spreadsheet models have limited processing capabilities. A typical complex system that integrates multiple configurations, deployed to multiple locations over a term of years, cannot be effectively modeled using spreadsheet based modeling tools.

Figure 2:
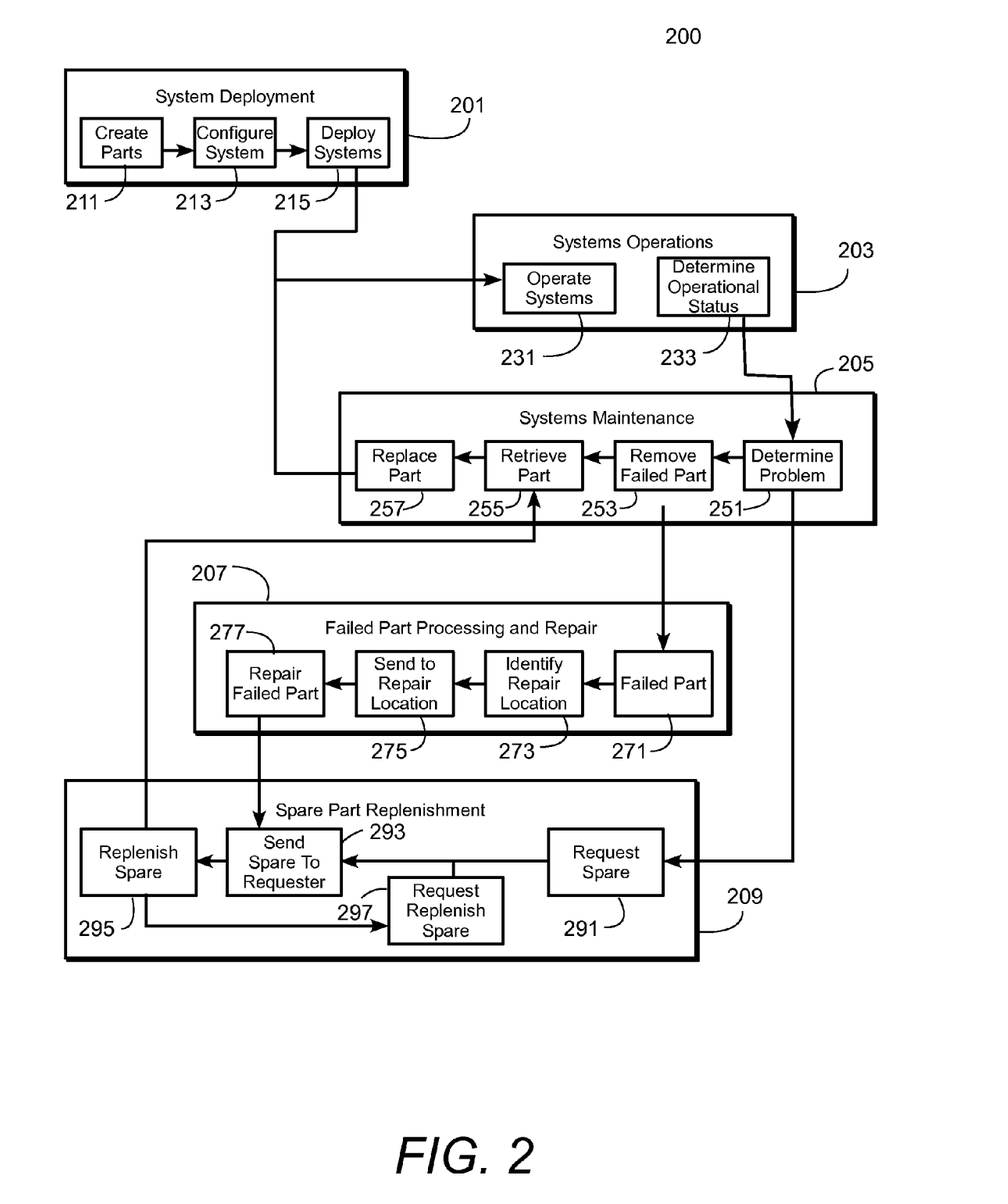
FIG. 2 is a block diagram of the operations of a system sustainment solution according to an embodiment of the disclosure.

FIG. 2 is a block diagram showing a system sustainment solution 200 according to an embodiment of the disclosure. At a high level, the sustainment solution 200 includes system deployment module 201, systems operations module 203, systems maintenance module 205, failed part processing and repair module 207 and spare part replenishment module 209.

System deployment 201 involves the initial stages of implementing a planned operations system. Deployment 201 includes creation of parts 211 for the system, the configuration of the system 213 and actual deployment of the configured system 215. Once system deployment 201 is performed, systems operations 203 may begin.

During systems operations 203 the system is operated as designed 231. While the system is operating, the operational status of the system is determined 233. The operational status may be determined by any number of means, including direct observation by operations or maintenance personnel, or through automated means such as system sensors which detect operational parameters relating to system components or outputs and determine that the detected values are within acceptable ranges. When the operational status of the system falls outside predetermined acceptable parameters, systems maintenance 205 may be required.

Systems maintenance 205 involves determining the problem 251 that caused the operational status of the system to fall outside of acceptable parameters. If the problem is determined to be a failed part, the failed part is removed 253, a replacement part is retrieved 255 from a store and the failed part is replaced 257 with the replacement part. Once the failed part is replaced, systems operations 203 may resume. During system maintenance 205, after the identified failed part is removed 253, the failed part is processed and repaired 207.

Failed part processing and repair 207 defines a process where the failed part 271 is identified and determines the appropriate repair location 273 for the failed part. The failed part is then sent to the determined repair location 275 and the failed part is repaired 277. After the failed part is repaired 277, the repaired part may be used to replenish inventory of spare parts 209.

In addition to repairing the failed part once it is discovered, a replacement for the failed part must be located and acquired to replace the part that failed. To obtain the required replacement, a request for a spare part 291 is made. If a replacement spare part is found, the spare part is sent to the requestor 293, and a request is made to replenish the spare part 297. In this way, an adequate inventory of spare part is maintained. The spare part is retrieved 255 as part of system maintenance 205, and the failed part is replaced with the spare part 257. The spare part may be received via the normal supply chain, or the spare part may be a refurbished part that was previously repaired 277.

Figure 3:
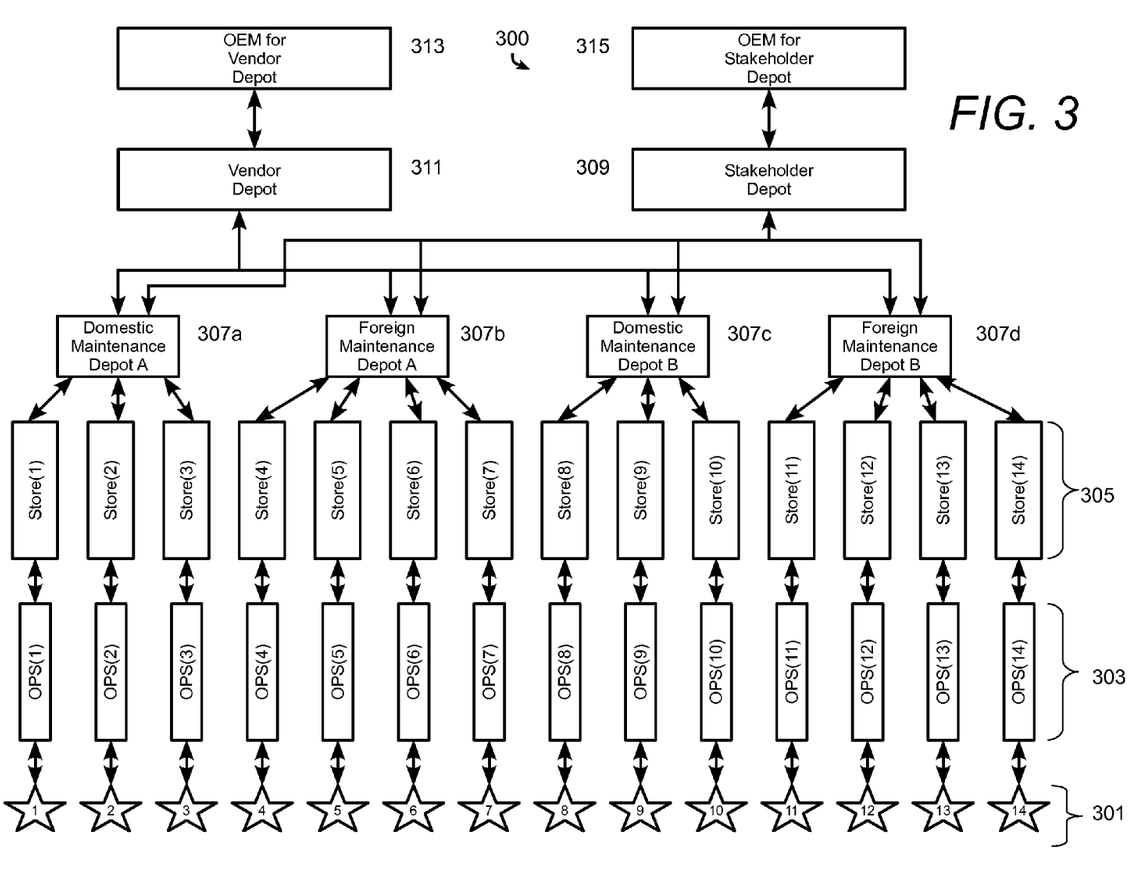
FIG. 3 is a block diagram of sustainment/supply chain structure used within a sustainment solution according to an embodiment of the disclosure.

FIG. 3 is a block diagram illustrating a sustainment support system structure 300, which may be analyzed by an integrated modeling system according to an embodiment of the disclosure. Parts for supporting the operations system 300 may be stored in a depot. A depot may be maintained by a vendor 311, or by a stakeholder (e.g. IPT) 309. An Original Equipment Manufacturer (OEM) for the stakeholder 315 makes and supplies parts to the stakeholder depot 309 and an OEM for the vendor makes and supplies part for the vendor depot 311. The vendor depot 311 and the stakeholder depot 309 store parts which may be sent and/or received to/from maintenance depots 307. The maintenance depots 307 may be divided in order to support various segments of the overall system. For example, maintenance depot 307a is a maintenance depot which supports domestic operations for a branch A of the system. Maintenance depot 307b supports foreign operations for branch A. By way of example, branch A may represent the Navy, while branch B, corresponding to domestic maintenance depot 307c and foreign maintenance depot 307d may be the Marines. Both branch A and branch B use common parts originating from the vendor depot 311 and the stakeholder depot 309 and maintain their own maintenance depots 307.

The maintenance depots 307 transfer parts in and/or out of stores 305. Maintenance depot 307a transfers parts in and out of stores 1-3, maintenance depot 307b transfers parts in and out of stores 4-7, maintenance depot 307c transfers parts in and out of stores 8-10, and maintenance depot 307d transfers parts in and out of stores 11-14. By way of example, systems relating to branches 303 perform system operations. The ongoing operations are monitored to determine an operational status of the system (233 shown in FIG. 2). If during monitoring of the operational status of the system a problem such as a failed part is identified, the failed part is removed and sent to the corresponding maintenance depot 307 for repair (275, shown in FIG. 2). Similarly, when a replacement part is needed to replace the failed part, a spare part is requested and a replenishment part to replace the requested spare is made. A refurbished part, repaired at the maintenance depot 307 may be provided to the store 305 to replenish the spare part inventory. Operations branches 303 provide operations and support for the operations systems 301.

According to an embodiment of the integrated modeling and analysis system according to the disclosure, the system 300 may include a stakeholder (IPT) responsible for logistics. In a military operations scenario, Logistics may maintain modeling information relating to the characteristics pertaining to logistics support of the overall operations system. These characteristics may be detailed in documents using the MIL-STD to describe the components of logistics support in a spreadsheet format. According to an embodiment of the disclosure, the documents maintained by Logistics are in MIL-STD format and may be directly imported into a database as input data sets. Other IPTs, such as Engineering, Reliability and Maintainability and Finance, may maintain similar documentation which may be directly imported to the database as additional input data sets.

The database stores information relating to the overall operations system which includes each segment defined by the independent IPTs. The database is in communication with a DES engine which may query the database before or during a simulation. The queries, in combination with input parameters specified by a user, extract the data provided by all IPTs to create a dynamic simulation model for the DES application, without the need for intervention by a developer to define a detailed DES model. The operation of the integrated modeling and analysis system will now be described with reference to FIG. 4.

Figure 4:
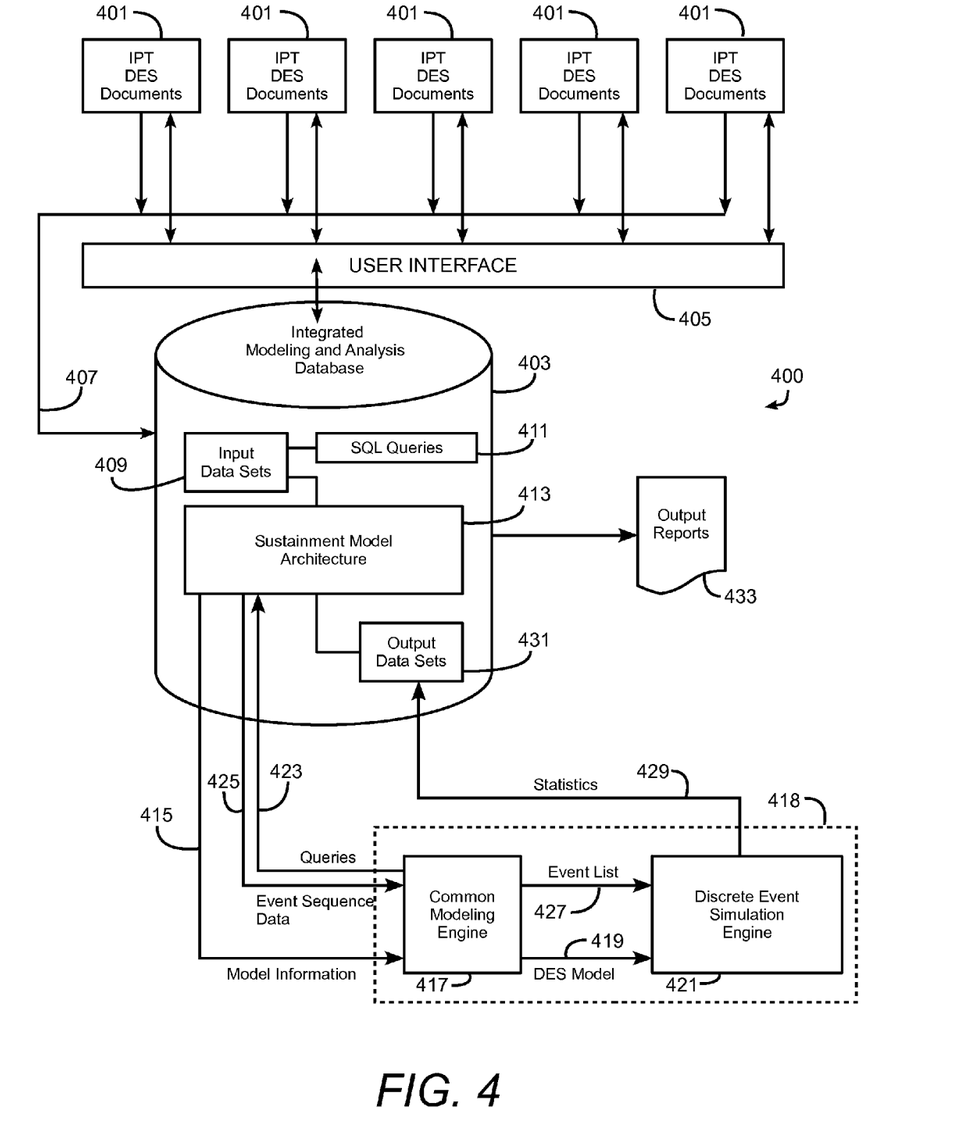
FIG. 4 is a block diagram of an integrated modeling and analysis system according to an embodiment of the disclosure.

FIG. 4 is a block diagram showing an integrated modeling and analysis system (IMAS) 400 according to an embodiment of the disclosure. The integrated modeling and analysis system includes a database 403. The database stores data in the form of input data sets 409, structured query language (SQL) queries 411, output data sets 431. According to an embodiment, data stored within the input data sets is selectively extracted and organized by the SQL queries 411 to define a structure representative of a sustainment model architecture 413. The SQL queries may define relationships between data elements contained in one input data set with one or more data elements in a second input data set.

Individual integrated product teams (IPTs) have responsibility over an associated product line which defines a component of the overall operations system. Multiple product lines are thereby integrated to create an overall system. By way of example, an operations and sustainment system may be defined through various IPTs 401, such as Engineering, Reliability and Maintainability, Logistics and Finance. Each IPT 401 may compile and maintain a model for their associated product line. The model may be structured as a DES model document used by a discrete event simulation program to provide an input to the simulation that models the IPT's product line. The model documents maintained by the IPT 401 may be formatted in a spreadsheet format which stores information in the spreadsheet according to a standard such as MIL-STD.

Each IPT is tasked with maintaining modeling information for its specific product line. For example, Finance maintains model information relating to costs of operating and maintaining the system; Engineering may maintain modeling information for individual parts or assemblies which make up the operational system; Reliability and Maintainability may maintain model information relating to the upkeep, Maintenance and Repair or Operations Systems, and Logistics may maintain model information representing the supply chain, including vendor information and part stores in the supply chain.

In order to model the overall system and capture a comprehensive view of the system which integrates, Finance, Engineering, Reliability and Maintainability, and Logistics, the relationships between the product lines belonging to each of these IPTs 401 must be identified. Then, the input data to the DES application must be reconfigured to define the inter-relationships between data elements originating from different IPT models. Conventionally, the data was reconfigured manually. A programmer proficient in DES programming would create a new spreadsheet based DES model which included data elements originating from different IPTs 401 and organize the data to represent relationships between different data elements. Once the data was reconfigured, the resultant DES model was a static object, which the DES engine used to run a simulation based on a pre-determined sequence of events. When the simulation ends, output statistics based on the static model that was used as input is provided. Manual programming, however, may not identify every inter-relationship that exists between data elements. Furthermore, as a simulation progresses, changes to the system states resulting from simulated events may further affect other data elements, or relationships between data elements. These changes are subtle, and may not be captured by a static model. The IMAS provides an improved DES model for a system by directly importing the IPT DES model to the database as input data sets 409. SQL queries 411 may be used to link fields in the input data sets 409 to represent relationships in the data and to extract data based on criteria generated by the DES application 418 as the simulation runs. The input data sets 409 and the SQL queries 411 which define the relationships between data elements form a sustainment model architecture 413 in combination with the output data sets 431 created from statistics 429 generated during the simulation.

A user interface 405 is associated with the IMAS database 403. The user interface 405 is accessible by at least one of the IPTs 401. Through the user interface 405, a user associated with one of the IPTs 401 can specify the input parameters for a desired simulation. Based on the input parameters, the IMAS database 403 executes one or more SQL queries 411 that extract selected data from the input data sets 409 based at least in part, on data relationships defined by the queries 411. The data in the input data sets 409 may possess interrelationships between the input data from a first IPT 401 and a second IPT 401. Based on the SQL query operations selected in the user interface 405, a subsample of the data in input data sets 409 is extracted based on relationships between data stored in different data sets. In this manner, subtle inter-relationships between aspects of different product lines from different IPTs 401 influence the data that is extracted and thereby affect the simulation.

A DES application 418 is in communication with the database 403. The DES application 418 includes a common modeling engine (CME) 417 that models a target system and creates an event list 427 containing a hierarchical list of events relating to the DES model 419 of the system. The DES application 418 further includes a DES engine 421. The DES engine 421 performs the simulation loop based on the event list 427 and DES model 419 provided by the CME 417.

The CME 417 operates in communication with database 403 and executes SQL queries 423 which extract selected data from the sustainment model architecture 413 based on the input data sets 409 and the input parameters. The data extracted from the sustainment model architecture 413 defines system model information 415 and data related to the discrete event sequence 425. This information allows the common modeling engine 417 to create the event list 427 and DES model 419 provided to the DES engine 421 without further manual intervention.

As the DES engine 421 performs the simulation loop by executing each simulated event in the event list 427, the results of the simulation are embodied as statistics 429 which are stored in the database 403 as output data sets 431. The output data sets 431 further contribute to the sustainment model architecture 413. That is, in combination with the input data sets 409 received from the IPT's 401 as DES modeling documents and the SQL queries 411 which define the data relationships, the output data sets 431 serve to provide updated statuses of the data elements in the system. The updated statuses are used by the DES application 418 during the simulation. As the database 403 is queried 423 by the CME 417 to provide updated model information 415 as the simulation is running, a dynamic DES model 419 is provided which reflects changes to the system states as a result of the ongoing simulation. This allows for subsequent events to access an updated system model which better reflects the system at that point of the simulation.

The output data sets 431 created by the simulation are used to generate output reports 433 based on the sustainment model architecture 413. Because the output data sets 431 and the architecture are housed within a database 403 as opposed to a flat data format such as a spreadsheet, the output reports may be generated and formatted into a variety of different file formats. The selected format may be chosen based on a user preference. The format may be selected to provide output reports used by the end user as part of the overall system analysis where the format is compatible with the analysis tools used by the user. For example, according to an embodiment, the IMAS database 403 may be implemented in a Microsoft Access® relational database. The output reports 433 may be selected to be in a format that is compatible with Microsoft Excel® or alternatively, a project management program such as Microsoft Project®. While the above provides specific examples of output formats which may be used for output reports 433, other formats may be used. By way of example, the Open Database Connectivity (ODBC) interface may be used. In this manner, the data stored in database 403 may be provided in any format adhering to the ODBC standard. Thus, the IMAS system provides dynamic system modeling with increased flexibility. In addition, because the IMAS database 403 receives the DES modeling documents directly from the IPTs 401 and imports them directly to the database 403, any updates to a DES model pertaining to an individual IPT 401 is reflected immediately in the sustainment model architecture 413, without the need for intervention by a programmer (i.e. code changes). The updated DES model information is immediately stored in the input data sets 409 and the up-to-date model information is immediately merged into the sustainment model architecture 413. Thus, the IMAS system seamlessly links the DES model information maintained by separate IPTs 401.

Figure 5:
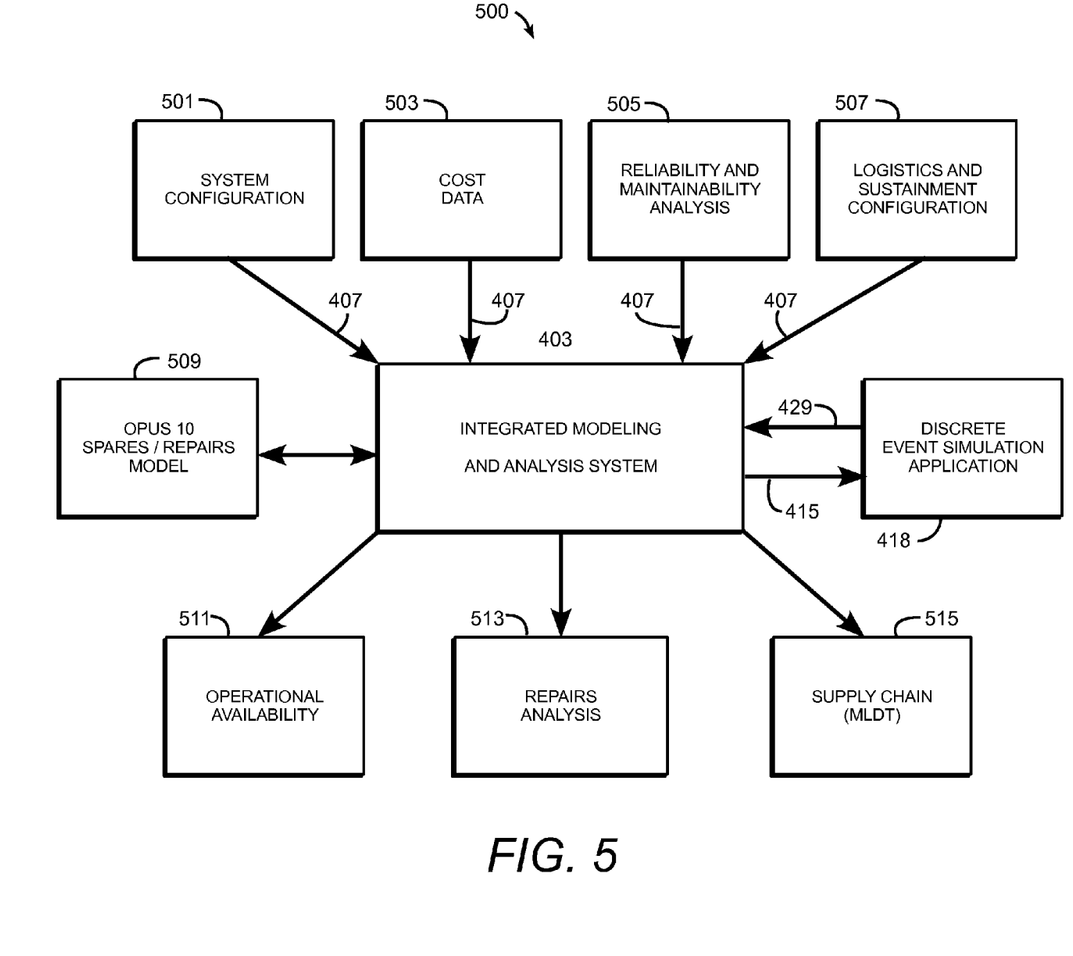
FIG. 5 is a block diagram of an integrated modeling and analysis system according to an embodiment of the disclosure.

FIG. 5 is a high level block diagram illustrating a global sustainment solution 500 according to an embodiment of the disclosure. Integrated project teams maintain documents relating to components of the global sustainment system 500, which include design information representative of a system configuration 501. In a given global sustainment solution 500, there may be more than one system configuration 501. Each system configuration 501 is associated with one or more IPTs which maintain documents relating to the specific system configuration 501. Cost data 503 relating to each aspect of the global sustainment solution 500 is maintained by IPTs responsible for the Finance function of the organization. Other IPTs are responsible for reliability and maintainability analysis 505 of the system. These IPTs maintain documents and detailed modeling information relating to the reliability and maintainability of various components of the system. Logistics and sustainment configuration information is maintained by one or more IPTs and provide the supply chain for providing operation systems with spare parts for repairs. The supply chain includes the procurement and repair of failed parts as well as the logistics involved in getting replacement parts from the manufacturer or storage depot to the location of the system in need of repair.

Information contained in the documents maintained by the IPTs responsible for configuration 501, cost data 503, reliability and maintainability analysis 505 and logistics and sustainment configuration 507 may be stored according to a standard format. Standardization of the incoming data allows the documents to be imported to input data sets stored as a series database tables in the IMAS 403. Using the imported data sets, a model architecture is defined within the IMAS which provides a DES model that is used by the DES application. The DES application 418 includes a CME which receives the model architecture information 415 from the IMAS 403. The DES application 418 also includes a DES engine which runs the simulation based on the model created by the CME. As the simulation proceeds, the DES engine generates statistical data relating to the state of the various system components. The statistical data 429 is provided as output by the DES application 418 and stored as output data sets in tables included in the IMAS 403.

The output data from OPUS 10 sustainment models, can used to provide initial input parameters for IMAS, such as the allocation of spares per part, per sparing location.

Output data for each operation performed within the model is written to a series of output data sets within the IMAS database 403. This data is then used to generate reports that are customizable to the stakeholder and to the requirements of the modeled system. The output data is stored in a hierarchical structure which allows for increased levels of fidelity in the overall system analysis and provides quick observations with respect to the system's key performance and cost drivers. The output data may be presented in a format that is compatible with legacy analysis tools already being used by the stakeholder. According to one non-limiting embodiment, the output data is processed and presented in a format which can be read and loaded by Microsoft Project®. This allows the data to be used in combination with the visual and analytical representations provided by the analysis tools with regard to each component within each deployed system. Further, the output tool may be used to provide a hierarchical representation of the performance of each system and the components that comprise each system.

It will be understood by those of skill in the art, that various components and processes described in this specification may be achieved through the use of hardware, software or a combination of hardware and software. The processes may be performed by a general purpose computer having a processor in communication with a memory. The memory may have stored therein instructions executable by the processor. Upon execution of the stored instructions by the processor, the processor acts as a special purpose computer for performing the described processes. The instructions may be stored on a non-transitory machine readable medium from which the instructions may be read and executed by a processor to perform the described processes. A computer configured to perform the described processes may be in communication with other computers or system components through a communications network implemented through appropriate input and output ports in the computer which links the computer to other computers or system components.

Thus, there has been disclosed a system according to an aspect of the disclosure that provides a platform to perform time phased analysis on the life cycle of multiple system configurations, deployed to multiple locations, during multiple different time periods. The platform provides the capability to rapidly test and validate multiple sustainment solutions against the interactions of system operations within a designated supply chain structure. Furthermore, through the implementation of a central database, the system integrates data sets from contributing IPTs used for spreadsheet models with a discrete event simulation model. The data sets together with a series of SQL queries define the model architecture, thereby driving a common modeling engine within the discrete event simulation. Upon loading and throughout the simulation scenario queries define the sequence of operations within the system architecture that need to be executed. As each operation executes, statistics on the operation, and the system executing the operation are collected and written to data sets within the database. Upon completion of the simulation scenario, the database processes the output data into a series of customizable reports that identify the behavior and relationships between the system operations and the sustainment of those systems. In one configuration, the system includes a customizable user interface within the database (e.g. MS-Access dB) that enables stakeholders to link and unify data sets from contributing IPTs from various disciplines (e.g. Engineering, Reliability and Maintainability, Finance and Logistics) into a central location; optimize and generate new test scenarios; load and run model scenarios into the CME (e.g. Arena based CME); collect output data from the CME and generate test reports; and archive and/or retrieve test scenarios. Modification of data sets by IPTs causes changes that are automatically reflected within the model architecture without source code modification, while direct traceability between the input data sets and the output data and analysis is achieved and captured through the database relationships.

While particular embodiments of the invention have been illustrated and described, various modifications and combinations can be made without departing from the spirit and scope of the invention, and all such modifications, combinations, and equivalents are intended to be covered and claimed.

What is claimed is:

1. An integrated modeling and analysis system (IMAS) configured to model a system in a discrete event simulation (DES) the system comprising:
a first processor in communication with a first memory, the first memory configured to store instructions that when executed by the first processor cause the first processor to:
define a database configured to:
directly import a plurality of input data sets, each of the plurality of input data sets corresponding to DES model document data from one of a plurality of integrated product teams (IPT), each of the plurality of input data sets being maintained by one of the plurality of IPTs and representing a model for a product line which represents a portion of an overall operations system;
store SQL queries which define relationships between data elements in different input data sets by defining relationships between parameters of the plurality of input data sets;
store a sustainment model architecture;
store output data sets comprising statistics generated by simulations;
create a user interface for receiving, from a user device, at least one input parameter for running a simulation of the overall operations system;
responsive to receipt of the at least one input parameter, execute one or more of the stored SQL queries; and
responsive to execution of the one or more stored SQL queries, extract and organize selected data from the plurality of input data sets to define the sustainment model architecture in the database;
a second processor in communication with a second memory, the second memory containing instructions that when executed by the second processor cause the second processor to:
access a DES application including a common modeling engine (CME) and a DES engine, the DES application in communication with the database via the first processor;
execute, by the CME, SQL queries which extract selected data from the sustainment model architecture, said selected data defining a dynamic DES system model;
create, by the CME based upon the defined DES system model, a chronological event list, each event of the event list including event type data;
execute, by the DES engine, a simulation for each event in the event list using the dynamic DES model provided to the DES engine by the CME and software code selected based upon the event type data; and
generate, based on the simulation for each event, statistics data corresponding to the simulation for the event;
wherein the first processor is further configured to:
store, for each event, an output data set in the database corresponding to the statistics data generated based on the simulation for the event; and
dynamically adapt the sustainment model architecture based upon the output data set generated by the simulation for each event; and
responsive to a query from the CME, provide adapted model information to the CME based upon the dynamically adapted sustainment model architecture;
wherein the second processor is further configured to:
repeat the steps of querying the model information from the sustainment model architecture in the database and generating statistics data corresponding to the simulation for each event until each event in the event list has been simulated; and
wherein said first processor is further configured to create at least one output report based on the more than one input data set, the at least one output data set and the at least one input parameter.

2. The system of claim 1, wherein the defined DES system model is at least partially based on the at least one input parameter.

3. The system of claim 1, wherein the at least one output report is configured in a format specified by a user via the user interface.

4. The system of claim 1, wherein the second processor is further configured to periodically execute SQL queries which extract updated DES system model data based on the statistics data generated during performance of the simulation.

5. The system of claim 1, wherein the user interface is configured to allow the user to retrieve a previously run simulation.

6. The system of claim 1, wherein the first processor is further configured to store at least one set of input parameters entered via the user interface.

7. The system of claim 1 wherein the DES model document data is imported in a spreadsheet format.

8. The IMAS of claim 1, wherein the imported DES model document data contains information relating to at least a first system configuration and a second system configuration.

9. The system of claim 1, wherein the imported DES model document data contains information relating to a first system component operating in a first location and a second system component operating in a second location.

10. The system of claim 1, wherein the imported DES model document data contains information relating to a first system component operating during a first time interval and a second system component operating during a second time interval.

11. The system of claim 10, wherein the first system component is the same as the second system component.

12. The system of claim 1, wherein the imported DES model document data includes information on a time interval at which a system component is operated.

* * * * *